United States Patent
Chen et al.

(10) Patent No.: US 7,439,091 B2
(45) Date of Patent: Oct. 21, 2008

(54) LIGHT-EMITTING DIODE AND METHOD FOR MANUFACTURING THE SAME

(75) Inventors: Shi-Ming Chen, Tainan (TW); Mau-Phon Houng, Tainan Hsien (TW); Chang-Hsing Chu, Taichung Hsien (TW); Te-Chi Yen, Tainan Hsien (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 11/709,543

(22) Filed: Feb. 22, 2007
(Under 37 CFR 1.47)

(65) Prior Publication Data
US 2007/0221927 A1    Sep. 27, 2007

(30) Foreign Application Priority Data
Mar. 17, 2006    (TW) ................ 95109340 A

(51) Int. Cl.
*H01L 21/00* (2006.01)

(52) U.S. Cl. .................. 438/32; 438/42; 438/39; 438/71; 257/91; 257/436; 257/435; 257/E21.291

(58) Field of Classification Search ........ 438/603, 438/604, 605, 22, 26, 42, 32, 39, 71; 257/91, 257/436, 435, E21.291
See application file for complete search history.

(56) References Cited

U.S. PATENT DOCUMENTS 6,225,647 B1    5/2001    Kurtz et al.
6,900,473 B2 *  5/2005    Yoshitake et al. ............. 257/95

FOREIGN PATENT DOCUMENTS

| JP | 6069539 | 3/1994 |
| JP | 6077527 | 3/1994 |
| JP | 9260791 | 10/1997 |
| JP | 2001305360 A | 10/2001 |

* cited by examiner

*Primary Examiner*—Matthew S. Smith
*Assistant Examiner*—Julio J. Maldonado
(74) *Attorney, Agent, or Firm*—Winston Hsu

(57) ABSTRACT

A light-emitting diode (LED) and a method for manufacturing the same are described. The method for manufacturing the LED comprises the following steps. An illuminant epitaxial structure is provided, in which the illuminant epitaxial structure has a first surface and a second surface on opposite sides, and a substrate is deposed on the first surface of the illuminant epitaxial structure. A metal layer is formed on the second surface of the illuminant epitaxial structure. An anodic oxidization step is performed to oxidize the metal layer, so as to form a metal oxide layer. An etching step is performed to remove a portion of the metal oxide layer, so as to form a plurality of holes in the metal oxide layer.

26 Claims, 12 Drawing Sheets

LIGHT-EMITTING DIODE AND METHOD FOR MANUFACTURING THE SAME

RELATED APPLICATIONS

The present application is based on, and claims priority from, Taiwan Application Serial Number 95109340, filed Mar. 17, 2006, the disclosure of which is hereby incorporated by reference herein in its entirety.

FIELD OF THE INVENTION

The present invention relates to a method for manufacturing a light-emitting diode (LED), and more particularly, to a method for increasing the light extraction efficiency of a light-emitting diode.

BACKGROUND OF THE INVENTION

Semiconductor light-emitting devices, such as light emitting diodes (LED), are formed by using semiconductor materials. The semiconductor light emitting devices are one kind of minute solid-state light sources that can transform electrical energy into light energy. The semiconductor light emitting devices are not only small in volume, use a low driving voltage, rapid in response speed, shockproof, and long-lived, but also can meet the lightness, thinness, and miniaturization needs of various apparatuses, and thus have been widely applied in various electric products in daily life.

Currently, a very common method for increasing the light output of light-emitting diode devices is to increase the light extraction efficiency of the light-emitting diodes. The methods for increasing the light extraction efficiency of light-emitting diodes substantially includes several methods described as following. The first method is to roughen the surface of the light-emitting diode by directly etching the surface of the light-emitting diode, so as to achieve the effect of increasing the light extraction efficiency of the light-emitting diode. In the method of roughening the surface of the light-emitting diode, a local region of the surface is usually protected by a mask, and wet etching or dry etching us performed to achieve the effect of roughening the surface. However, in this conventional method for roughening the surface, the uniformity of the roughening surface is poor. The second method is to change the figure of the light-emitting diode by etching. The third method is to set a reflection mirror. However, the processes of the second method and the third method are more complicated, so that the process yield is poor.

Therefore, the conventional techniques of increasing the light extraction of the light-emitting diode are not desirable.

SUMMARY OF THE INVENTION

Therefore, one objective of the present invention is to provide a method for manufacturing a light-emitting diode, in which a metal layer on a surface of the light-emitting diode is oxidized by an anodic oxidization method, and a portion of the produced metal oxide layer is removed by etching, so that a plurality of uniform nanoscale holes are produced to achieve the effect of roughening the surface of the light-emitting diode, thereby effectively enhancing the light extraction of the light-emitting diode.

Another objective of the present invention is to provide a method for manufacturing a light-emitting diode, by an anodic oxidization and etching method and by controlling the etching parameters, a plurality of nanoscale holes arranged uniformly can be formed, and the sizes of the holes and the pitches between the holes can be precisely controlled. Therefore, the process of the method is very simple, thereby effectively increasing the yield.

Still another objective of the present invention is to provide a light-emitting diode, in which the light-extracting surface is set with an anodic oxidization metal layer, and the anodic oxidization metal layer includes a plurality of nanoscale holes arranged uniformly, so that the light-emitting diode has superior light extraction efficiency, thereby greatly increasing the light output of the light-emitting diode and effectively broadening the application scope of the light-emitting diode.

According to the aforementioned objectives, the present invention provides a method for manufacturing a light-emitting diode, comprising: providing an illuminant epitaxial structure, wherein the illuminant epitaxial structure has a first surface and a second surface on opposite sides, and a substrate is deposed on the first surface of the illuminant epitaxial structure; forming a metal layer on the second surface of the illuminant epitaxial structure; performing an anodic oxidization step to oxidize the metal layer, so as to form a metal oxide layer; and performing an etching step to remove a portion of the metal oxide layer, so as to form a plurality of holes in the metal oxide layer.

According to the aforementioned objectives, the present invention further provides a method for manufacturing a light-emitting diode, comprising: providing a substrate, wherein the substrate has a first surface and a second surface on opposite sides; forming an illuminant epitaxial structure on the first surface of the substrate, wherein the illuminant epitaxial structure comprises a first conductivity type semiconductor layer, an active layer and a second conductivity type semiconductor layer stacked on the substrate in sequence, and the first conductivity type semiconductor layer and the second conductivity type semiconductor layer have different conductivity types; removing a portion of the second conductivity type semiconductor layer and a portion of the active layer to expose a portion of the first conductivity type semiconductor layer; forming a metal layer on the second surface of the substrate; performing an anodic oxidization step to oxidize the metal layer, so as to form a metal oxide layer; performing an etching step to remove a portion of the metal oxide layer, so as to form a plurality of holes in the metal oxide layer; providing a sub-mount, wherein at least two bonding bumps are set on a surface of the sub-mount; and performing a flip chip step to make the exposed portion of the first conductivity type semiconductor layer and the second conductivity type semiconductor layer respectively connect with the bonding bumps on the sub-mount.

According to a preferred embodiment of the present invention, the etching step comprises using an etch solution, wherein the etch solution is preferably an acid solution, and is more preferably a phosphoric acid solution, an oxalic acid solution or a sulfuric acid solution. Besides, a material of the metal layer is Al, Mn, Zn, Ni, Ag or Ti, for example. The illuminant epitaxial structure is composed of AlGaInP based materials, InAlGaAs based materials or AlGaInN based materials, for example.

According to the aforementioned objectives, the present invention further provides a light-emitting diode, comprising: an illuminant epitaxial structure having a first surface and a second surface on opposite sides, and a substrate is deposed on the first surface of the illuminant epitaxial structure; and an anodic oxidization metal layer deposed on the second surface of the illuminant epitaxial structure, wherein the anodic oxidation metal layer is formed from a metal layer, and the anodic oxidation metal layer includes a plurality of holes.

According to the aforementioned objectives, the present invention further provides a light-emitting diode, comprising: a substrate having a first surface and a second surface on opposite sides; an illuminant epitaxial structure on the first surface of the substrate, wherein the illuminant epitaxial structure comprises a first conductivity type semiconductor layer, an active layer and a second conductivity type semiconductor layer stacked on the substrate in sequence, a stacked structure composed of the active layer and the second conductivity type semiconductor layer exposes a portion of the first conductivity type semiconductor layer, and the first conductivity type semiconductor layer and the second conductivity type semiconductor layer have different conductivity types; an anodic oxidation metal layer deposed on the second surface of the substrate, wherein the anodic oxidation metal layer is formed from a metal layer, and the anodic oxidation metal layer includes a plurality of holes; and a sub-mount, wherein at least two bonding bumps are set on a surface of the sub-mount, and the exposed portion of the first conductivity type semiconductor layer and the second conductivity type semiconductor layer respectively connect with the bonding bumps on the sub-mount.

According to a preferred embodiment of the present invention, dimensions of the holes are between about 1 nm and about 1000 nm.

The anodic oxidation metal layer including nano holes orderly distributed in the light-extracting surface of the light-emitting diode can be formed to easily achieve the effect of roughening the light-extracting surface of the light-emitting diode by performing an anodic oxidization step and an etching step on the metal on the light-extracting surface. Accordingly, the process of the present invention is simpler and can be performed easily for high yield. In addition, light emitted from the light-emitting diode device is more uniform, and the light-extracting efficiency of the device is superior.

BRIEF DESCRIPTION OF THE DRAWINGS

The foregoing aspects and many of the attendant advantages of this invention are more readily appreciated as the same become better understood by reference to the following detailed description, when taken in conjunction with the accompanying drawings, wherein.

DETAILED DESCRIPTION OF THE PREFERRED EMBODIMENT

The present invention discloses a light-emitting diode and a method for manufacturing the same, in which the effect of uniformly roughening the light-emitting surface of the light-emitting diode device can be easily achieved by an anodic oxidization and etching method. In order to make the illustration of the present invention more explicit, the following description is stated with reference to FIGS. 1a through 5f.

Figure 1A:
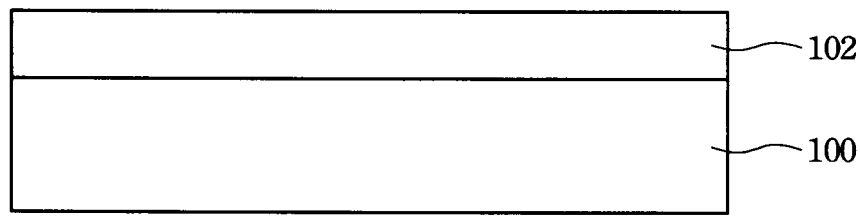
FIGS. 1a through 1d are schematic flow diagrams showing the process for manufacturing a light-emitting diode in accordance with a first preferred embodiment of the present invention.

FIGS. 1a through 1d are schematic flow diagrams showing the process for manufacturing a light-emitting diode in accordance with a first preferred embodiment of the present invention. Firstly, a substrate 100 is provided, wherein the substrate 100 includes two opposite surfaces. The substrate 100 may be made of a semiconductor material, such as GaAs or InP. An illuminant epitaxial structure 102 is grown on a surface of the substrate 100 by, for example, an epitaxial method, as shown in FIG. 1a. The illuminant epitaxial structure 102 is composed of AlGaInP based materials, InAlGaAs based materials or AlGaInN based materials, for example. Typically, the illuminant epitaxial structure 102 may comprise a first conductivity type semiconductor layer, an active layer and a second conductivity type semiconductor layer stacked on the substrate 100 in sequence, wherein the first conductivity type semiconductor layer and the second conductivity type semiconductor layer have different conductivity types. While the first conductivity type semiconductor layer is p-type, the second conductivity type semiconductor layer is n-type; and while the first conductivity type semiconductor layer is n-type, the second conductivity type semiconductor layer is p-type.

Figure 1B:
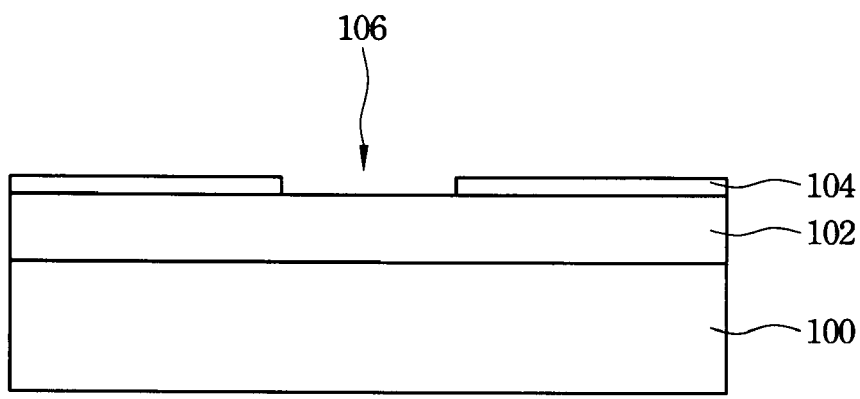

Next, a metal layer 104 is formed on the surface opposite to the surface of the substrate 100 where the illuminant epitaxial structure 102 is located by, for example, a sputtering method or an evaporation deposition method. The metal layer 104 is only formed on a portion of the surface of the illuminant epitaxial structure 102, by a photolithography and etching technique or a lift-off technique, so as to form an exposed portion 106 in the surface of the illuminant epitaxial structure 102, such as shown in FIG. 1b. The material of the metal layer 104 may be Al, Mn, Zn, Ni, Ag or Ti, and the thickness of the metal layer 104 is preferably between about 1 nm and about 1000 nm.

Figure 1C:
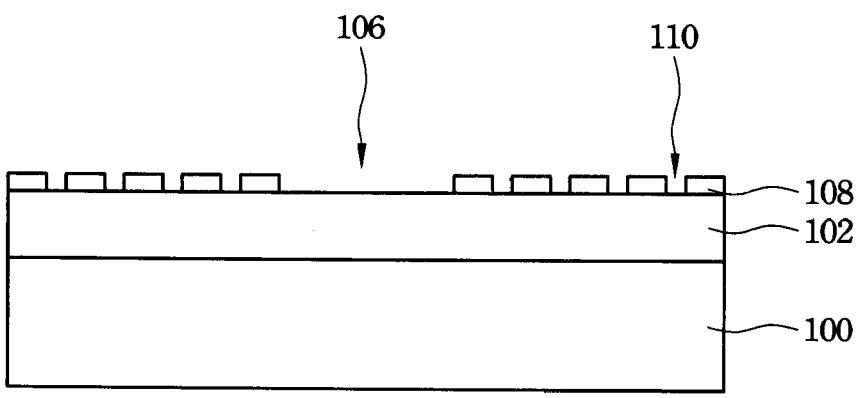
Figure 1D:
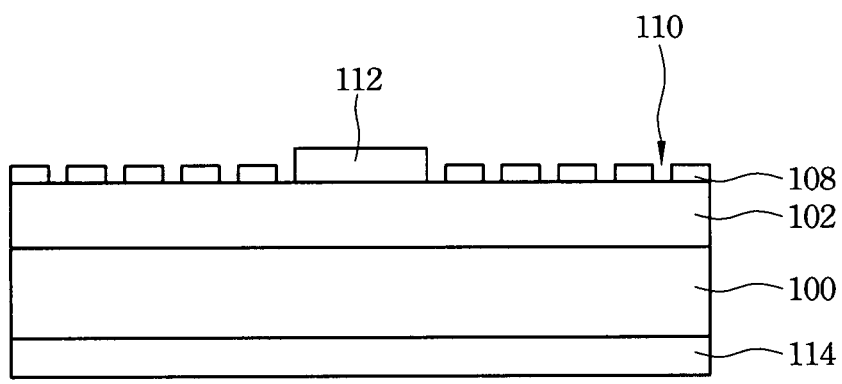
Figure 1E:
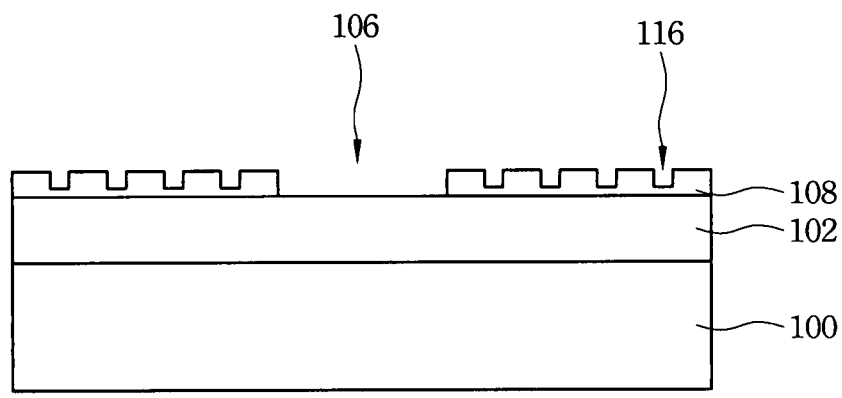
FIGS. 1e and 1f are schematic flow diagrams showing the modification process for manufacturing a light-emitting diode in accordance with the first preferred embodiment of the present invention.
Figure 1F:
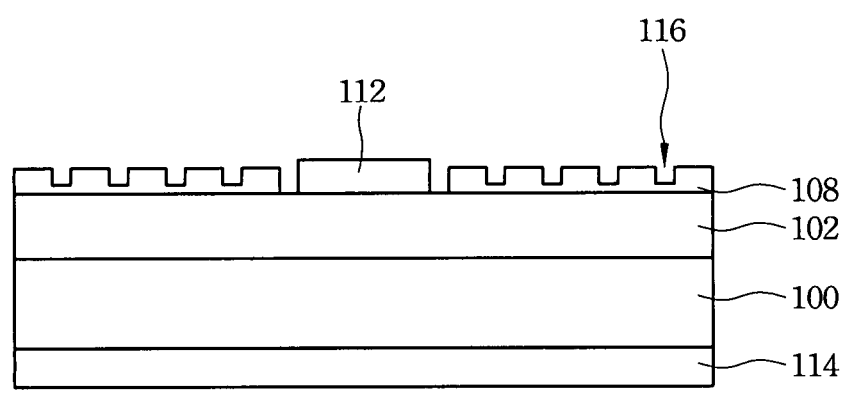

After the metal layer 104 is formed, an anodic oxidization step is performed on the metal layer 104 to make the metal layer 104 turn into a metal oxide layer 108. In the anodic oxidization step of the metal layer 104, a metal oxide layer 108 including a porous structure is formed, wherein a plurality of holes arranged orderly are formed in the surface of the metal oxide layer 108 by appropriately controlling the oxidation condition, such as oxidation voltage. In a preferred embodiment of the present invention, the reaction voltage is preferably controlled between about 2 V and about 100 V during the anodic oxidization step. As oxidization time goes on, the depths of the holes in the surface of the metal oxide layer 108 are increased. After the anodic oxidization process of the metal layer 104 is completed, a portion of the metal oxide layer 108 is removed by an etch solution through a wet etching method. The etch solution is preferably an acid solution, such as a phosphoric acid solution, an oxalic acid solution or a sulfuric acid solution. The surface of the metal oxide layer 108 includes the porous structure after the anodic oxidization step, so that a plurality of holes 110 are uniformly distributed in the metal oxide layer 108 after etching, as shown in FIG. 1c. The sizes of the holes 110 and the pitches between the holes 110 can be adjusted by modifying the parameters, such as the composition and the concentration of the etch solution, the etching time and temperature. In the present invention, the dimensions of the holes 110 may be between about 1 nm and about 1000 nm. In the present embodiment, the holes 110 penetrate through the metal oxide layer 108 to expose the underlying surface of the illuminant epitaxial structure 102. However, in other embodiments, after the metal oxide layer 108 is etched, a plurality of holes 116 distributed uniformly are formed, and the holes 116 do not penetrate through the metal oxide layer 108, as shown in FIG. 1e.

Alternatively, a substrate-thinned treatment is performed to decrease the thickness of the substrate 100. Next, an electrode 112 and an electrode 114 are respectively formed on the exposed portion 106 of the illuminant epitaxial structure 102 and the surface of the substrate 100 opposite to the illuminant epitaxial structure 102 shown in FIG. 1c or in FIG. 1e by, for example, a sputtering technique or an evaporation technique, so as to form a structure such as shown in FIG. 1d or in FIG. 1f. The electrodes 112 and 114 are preferably metal electrodes for better electrical conductivity.

In the present invention, the metal oxide layer including an uniform porous structure is formed after the anodic oxidization process of the metal is performed, and then a plurality of nanoscale holes are formed and distributed uniformly in the metal oxide layer by wet etching. Therefore, the entire process is very simple and uncomplicated. As a result, the roughening effect of the surface of the light-emitting diode device can be achieved easily, so that the light extraction of the light-emitting diode is increased. Furthermore, the holes in the metal oxide layer are arranged uniformly, so that the uniformity of the emitting-light of the device cannot be degraded, and the illuminant quality of the device can be enhanced.

Figure 2A:
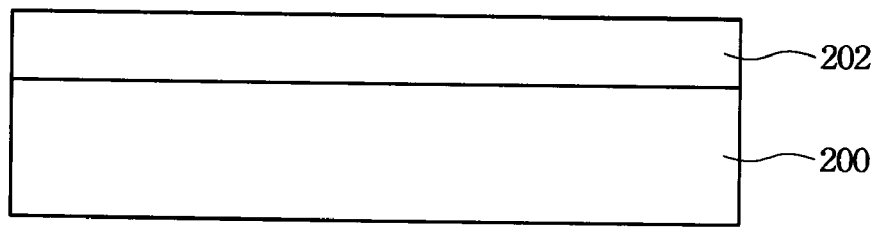
FIGS. 2a through 2e are schematic flow diagrams showing the process for manufacturing a light-emitting diode in accordance with a second preferred embodiment of the present invention.

FIGS. 2a through 2e are schematic flow diagrams showing the process for manufacturing a light-emitting diode in accordance with a second preferred embodiment of the present invention. In the embodiment, a substrate 200 is provided for epitaxial materials growing thereon, wherein a material of the substrate 200 may be a semiconductor material, such as GaAs, InP or sapphire. An illuminant epitaxial structure 202 is grown on a surface of the substrate 200 by, for example, an epitaxial method, as shown in FIG. 2a. The illuminant epitaxial structure 202 is composed of AlGaInP based materials, InAlGaAs based materials or AlGaInN based materials, for example. Typically, the illuminant epitaxial structure 202 may comprise a first conductivity type semiconductor layer, an active layer and a second conductivity type semiconductor layer stacked on the substrate 200 in sequence, wherein the first conductivity type semiconductor layer and the second conductivity type semiconductor layer have different conductivity types. While the first conductivity type semiconductor layer is p-type, the second conductivity type semiconductor layer is n-type; and while the first conductivity type semiconductor layer is n-type, the second conductivity type semiconductor layer is p-type.

Figure 2B:
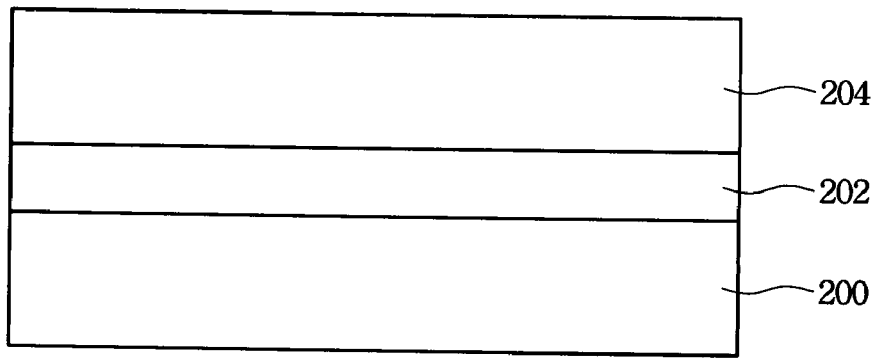
Figure 2C:
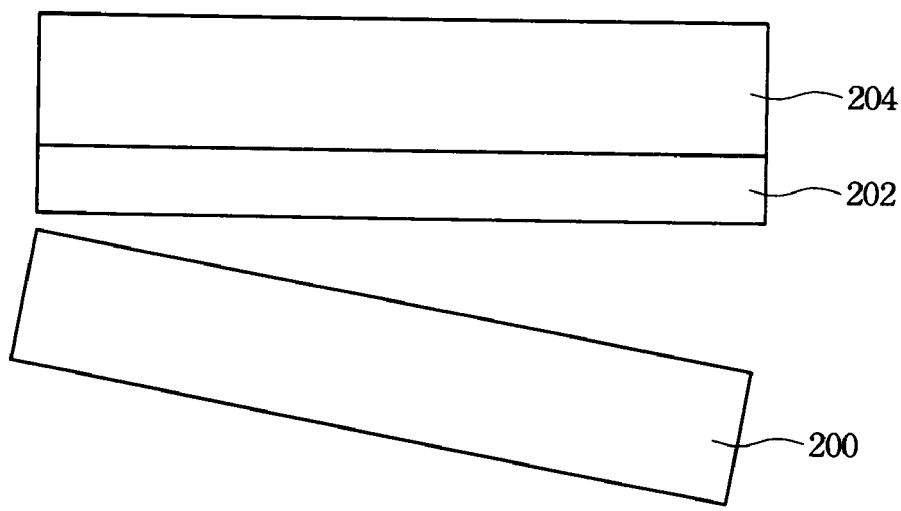

Then, another substrate 204 is provided and is jointed to a surface of the illuminant epitaxial structure 202 opposite to the surface where the growth substrate 200 is deposed by, for example, a wafer bonding method, such that a structure illustrated in FIG. 2b is formed. The substrate 204 is preferably composed of a material of good heat dissipating, such as Si, Cu or Mo. The growth substrate 200 is next removed by, for example, an etching technique, a polishing technique or a laser technique, until the surface of the illuminant epitaxial structure 202 where the growth substrate 200 is deposed is exposed, such as shown in FIG. 2c.

Figure 2D:
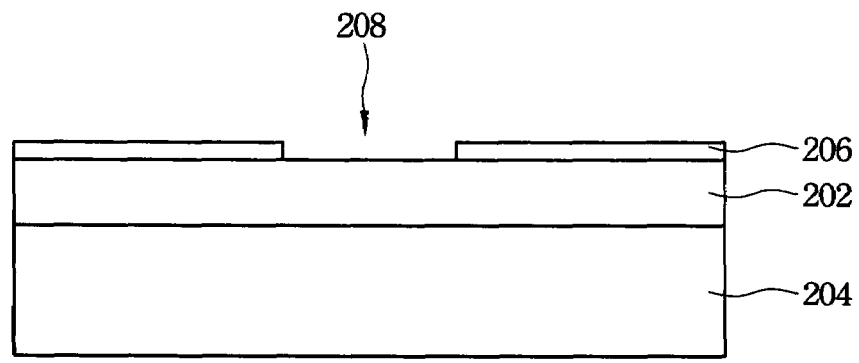

After the removal process of the growth substrate 200 is completed, a metal layer 206 is formed on the exposed surface of the illuminant epitaxial structure 202 opposite to the surface where the substrate 204 is deposed by, for example, a sputtering method or an evaporation deposition method. In the formation of the metal layer 206, the metal layer 206 is only formed on a portion of the exposed surface of the illuminant epitaxial structure 202 by a photolithography and etching technique or a lift-off technique, so as to form an exposed portion 208 in the surface of the illuminant epitaxial structure 202, such as shown in FIG. 2d. Similar to the first embodiment of the present invention, the material of the metal layer 206 may be Al, Mn, Zn, Ni, Ag or Ti, and the thickness of the metal layer 206 is preferably between about 1 nm and about 1000 nm.

Then, an anodic oxidization step is performed on the metal layer 206 to make the metal layer 206 turn into a metal oxide layer 210. In the anodic oxidization step of the metal layer 206, a metal oxide layer 210 including a porous structure is formed, wherein a plurality of holes arranged orderly are formed in the surface of the metal oxide layer 210 by appropriately controlling the oxidation condition, such as oxidation voltage. In a preferred embodiment of the present invention, the reaction voltage is preferably controlled between about 2 V and about 100 V during the anodic oxidization step. The depths of the holes in the surface of the metal oxide layer 210 can be controlled by adjusting the time of oxidization. Subsequently, a portion of the metal oxide layer 210 is removed by an etch solution through a wet etching method. The etch solution is preferably an acid solution, such as a phosphoric acid solution, an oxalic acid solution or a sulfuric acid solution. The surface of the metal oxide layer 210 includes the porous structure, so that a plurality of holes 212 are uniformly distributed in the metal oxide layer 210 after wet etching, to achieve the effect of roughening the light-extracting surface of the light-emitting diode device. The sizes of the holes 212 and the pitches between the holes 212 can be adjusted by modifying the parameters, such as the composition and the concentration of the etch solution, the etching time and temperature. In the present invention, the dimensions of the holes 212 may be between about 1 nm and about 1000 nm. In the present embodiment, the holes 212 penetrate through the metal oxide layer 210 to expose the underlying surface of the illuminant epitaxial structure 202. However, in other embodiments, after the metal oxide layer 210 is etched, a plurality of holes 218 distributed uniformly are formed, and the holes 218 do not penetrate through the metal oxide layer 210, as shown in FIG. 2f.

Figure 2E:
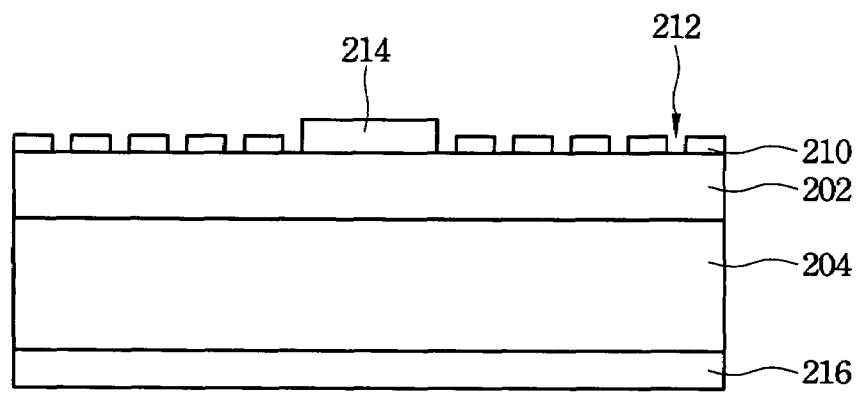
Figure 2F:
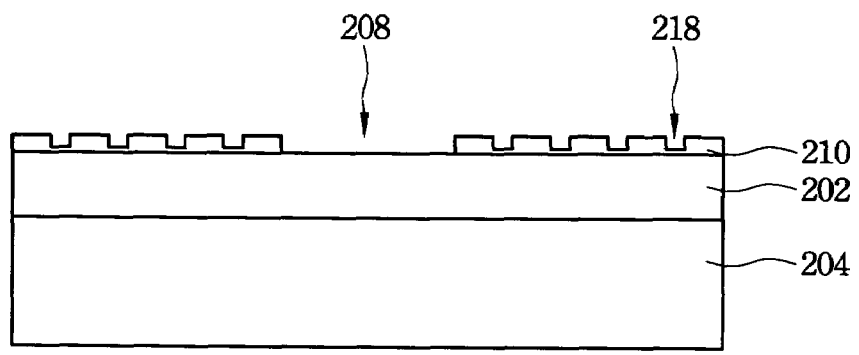
FIGS. 2f and 2g are schematic flow diagrams showing the modification process for manufacturing a light-emitting diode in accordance with the second preferred embodiment of the present invention.
Figure 2G:
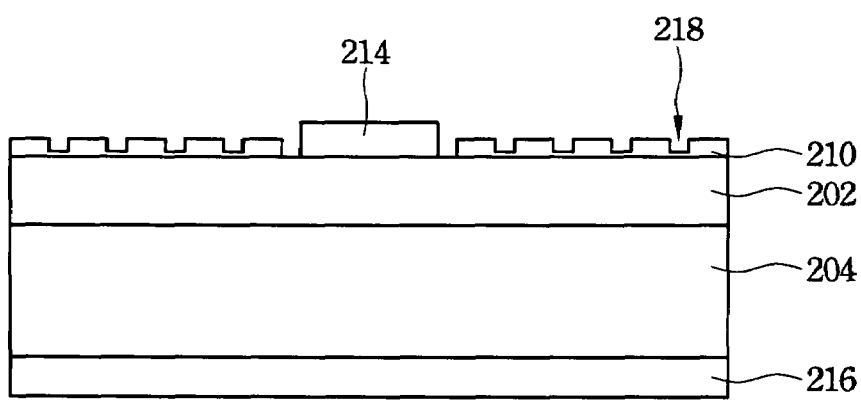

Next, an electrode 214 and an electrode 216 are respectively formed on the exposed portion 208 of the illuminant epitaxial structure 202 and the surface of the substrate 204 opposite to the illuminant epitaxial structure 202 by, for example, a sputtering technique or an evaporation technique, so as to complete the fabrication of the light-emitting diode device such as shown in FIG. 2e or in FIG. 2g. The electrodes 214 and 216 are preferably metal electrodes for better electrical conductivity.

The two embodiments described above relates to the fabrication of vertical conductivity light-emitting diode devices, and the invention can also be applied in the fabrication of the fabrication of light-emitting diode devices having two electrodes of different conductivity types set on the same side. FIGS. 3a through 3e are schematic flow diagrams showing the process for manufacturing a light-emitting diode in accordance with a third preferred embodiment of the present invention. The embodiment relates to the fabrication of a light-emitting diode device having two electrodes of different conductivity types set on the same side. Firstly, a substrate 300 is provided, wherein the substrate 300 is made of sapphire or SiC, for example. An illuminant epitaxial structure 310 is grown on a surface of the substrate 300 by, for example, an epitaxial method. The illuminant epitaxial structure 310 is composed of AlGaInN based materials, for example. Typically, the illuminant epitaxial structure 310 may comprise a first conductivity type semiconductor layer 304, an active layer 306 and a second conductivity type semiconductor layer 308 stacked on the substrate 300 in sequence, wherein the first conductivity type semiconductor layer 304 and the second conductivity type semiconductor layer 308 have different conductivity types. While the first conductivity type semiconductor layer 304 is p-type, the second conductivity type semiconductor layer 308 is n-type; and while the first conductivity type semiconductor layer 304 is n-type, the second conductivity type semiconductor layer 308 is p-type. In the present embodiment, a buffer layer 302 is alternatively deposited before the growth of the first conductivity type semiconductor layer 304 for successfully growing semiconductor materials on the substrate 300. Accordingly, the illuminant epitaxial structure 310 in the embodiment further comprises the buffer layer 302 between the substrate 300 and the first conductivity type semiconductor layer 304. For example, the material of the first conductivity type semiconductor layer 304 and the second conductivity type semiconductor layer 308 is GaN, and the active layer 306 is composed of an InGaN/GaN MQW structure.

Figure 3A:
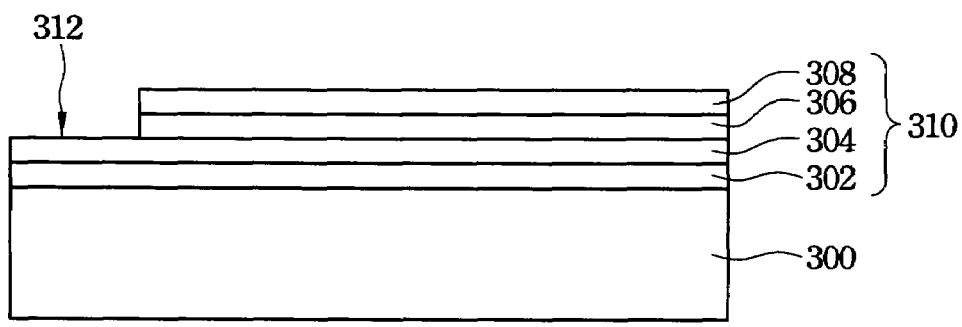
FIGS. 3a through 3e are schematic flow diagrams showing the process for manufacturing a light-emitting diode in accordance with a third preferred embodiment of the present invention.

After the illuminant epitaxial structure 310 is formed, a definition step is performed by, for example, a photolithograph and etching technique, so as to remove a portion of the second conductivity type semiconductor layer 308 and a portion of the active layer 306 until the underlying first conductivity type semiconductor layer 304 is exposed, and to make the first conductivity type semiconductor layer 304 have an exposed portion 312, such as shown in FIG. 3a.

Figure 3B:
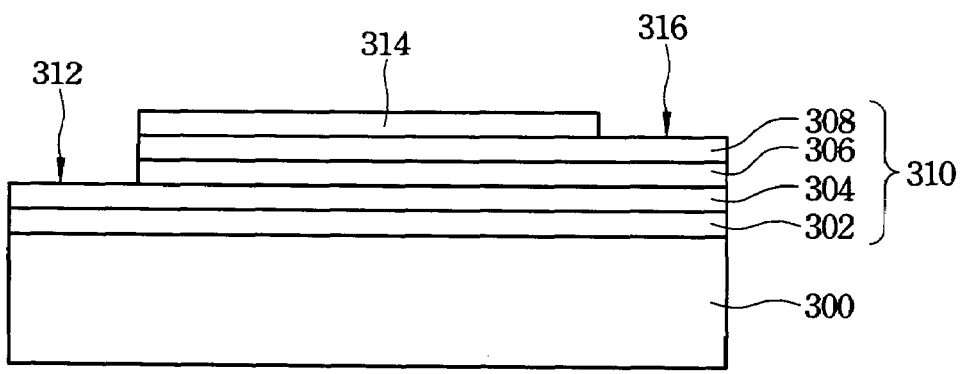

Then, a metal layer 314 is formed on a portion of the surface of the remaining second conductivity type semiconductor layer 308 by, for example, a sputtering method or an evaporation deposition method combining with a photolithograph and etching technique or a lift-off technique, so that the surface of the remaining second conductivity type semiconductor layer 308 has an exposed portion 316, such as shown in FIG. 3b. The material of the metal layer 314 may be Al, Mn, Zn, Ni, Ag or Ti, and the thickness of the metal layer 314 is preferably between about 1 nm and about 1000 nm.

Figure 3C:
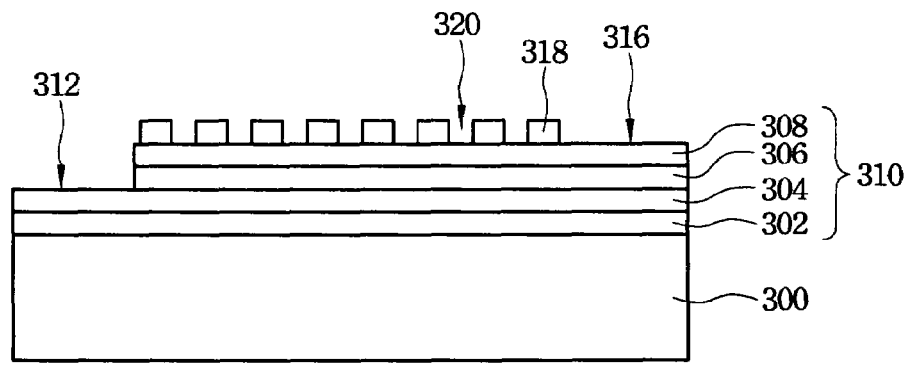
Figure 3D:
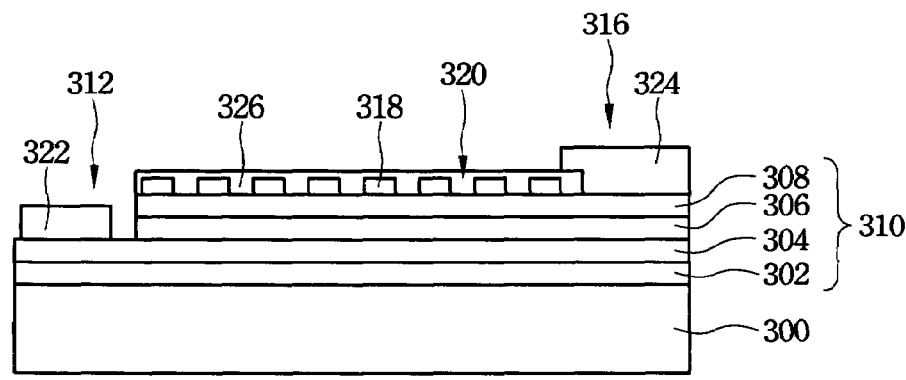
Figure 3E:
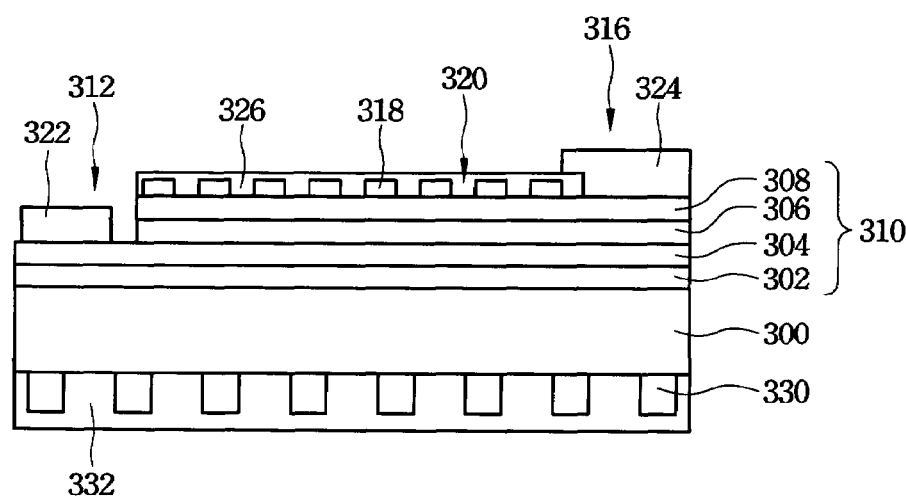
Figure 3F:
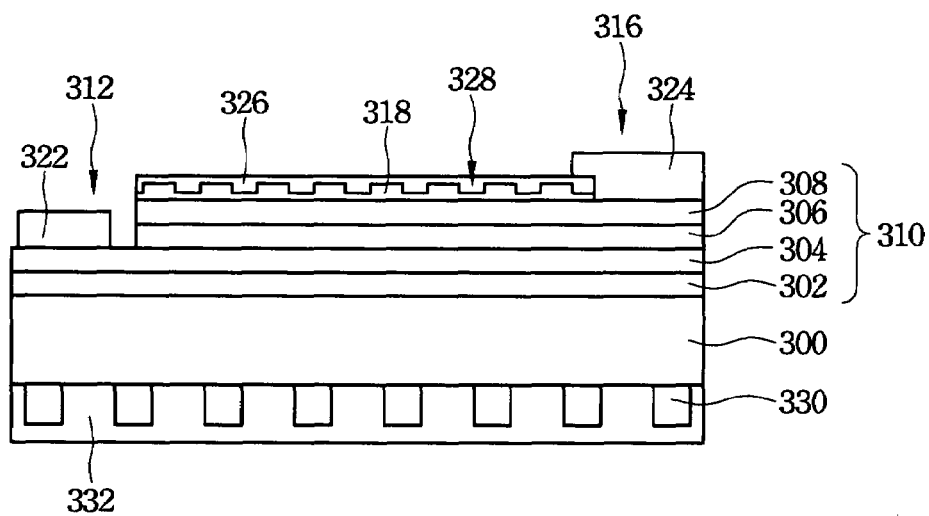
FIG. 3f is a schematic diagram showing the modification process for manufacturing a light-emitting diode in accordance with the third preferred embodiment of the present invention.

Next, an anodic oxidization step is performed on the metal layer 314 to make the metal layer 314 turn into a metal oxide layer 318. In a preferred embodiment of the present invention, the reaction voltage is preferably controlled between about 2 V and about 100 V during the anodic oxidization step. After the anodic oxidization step, the metal oxide layer 318 including a porous structure is formed from the metal layer 314. A plurality of holes arranged orderly are formed in the surface of the metal oxide layer 318 by appropriately controlling the oxidation condition, such as oxidation voltage. After the metal oxide layer 318 is formed, a portion of the metal oxide layer 318 is removed by an etch solution through a wet etching method. The etch solution is preferably an acid solution, such as a phosphoric acid solution, an oxalic acid solution or a sulfuric acid solution. The surface of the metal oxide layer 318 has included the holes arranged orderly, so that a plurality of holes 320 can be formed and uniformly distributed in the metal oxide layer 318 to achieve the effect of roughening the light-extracting surface of the light-emitting diode device. The sizes of the holes 320 and the pitches between the holes 320 can be adjusted by modifying the parameters, such as the composition and the concentration of the etch solution, the etching time and temperature. In the present invention, the dimensions of the holes 320 may be between about 1 nm and about 1000 nm. The holes 320 penetrate through the metal oxide layer 318 to expose the underlying surface of the second conductivity type semiconductor layer 308, such as shown in FIG. 3c. However, in other embodiments, after the metal oxide layer 318 is etched, a plurality of holes 328 distributed uniformly are formed, and the holes 328 do not penetrate through the metal oxide layer 318, as shown in FIG. 3f.

Then, a transparent electrode 326 is selectively formed to cover the metal oxide layer 318, the holes 320 and the surface of the second conductivity type semiconductor layer 308 exposed by the holes 320. A material of the transparent electrode 326 is, for example, ITO or IZO. Next, an electrode 322 and an electrode 324 are respectively formed on the exposed portion 312 of the first conductivity type semiconductor layer 304 and the exposed portion 316 of the second conductivity type semiconductor layer 308 by, for example, a sputtering technique or an evaporation technique, such as shown in FIG. 3d. The electrodes 322 and 324 are preferably metal electrodes for better electrical conductivity. However, in the present invention, the electrodes 322 and 324 can be directly formed without forming the transparent electrode 326. Alternatively, a substrate-thinned treatment is performed to decrease the thickness of the substrate 300. Subsequently, a metal oxide layer 330 including nano holes is formed on a portion of a surface of the substrate 300 opposite to the illuminant epitaxial structure 310 by, for example, deposition, anodic oxidization and etching processes, and the other portion of the surface of the substrate 300 is exposed. A dielectric layer 332 is formed to cover the metal oxide layer 330 and the exposed surface of the substrate 300 by, for example, a deposition method, so as to complete the light-emitting diode device, such as shown in FIG. 3e or FIG. 3f. A material of the dielectric layer 332 may be silicon oxide or silicon nitride for increasing the whole light extraction efficiency.

Figure 4A:
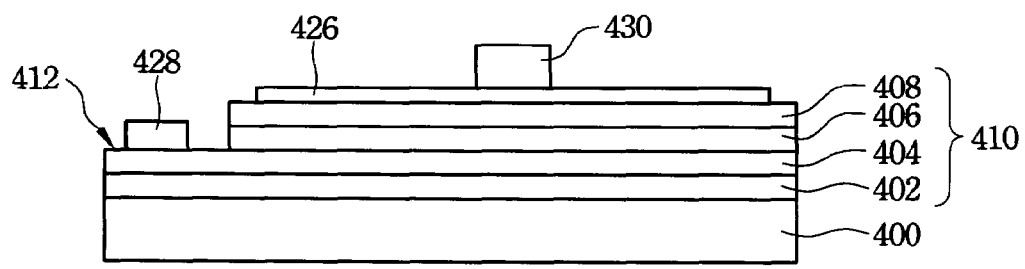
FIGS. 4a through 4e are schematic flow diagrams showing the process for manufacturing a light-emitting diode in accordance with a fourth preferred embodiment of the present invention.

FIGS. 4a through 4f are schematic flow diagrams showing the process for manufacturing a light-emitting diode in accordance with a fourth preferred embodiment of the present invention. In the present embodiment, a substrate 400 is firstly provided, wherein the substrate 400 may be made of sapphire or SiC. An illuminant epitaxial structure 410 is grown on a surface of the substrate 400 by, for example, an epitaxial method, wherein the illuminant epitaxial structure 410 may be composed of AlGaInN based materials. Typically, the illuminant epitaxial structure 410 may comprise a first conductivity type semiconductor layer 404, an active layer 406 and a second conductivity type semiconductor layer 408 stacked on the substrate 400 in sequence, wherein the first conductivity type semiconductor layer 404 and the second conductivity type semiconductor layer 408 have different conductivity types. While the first conductivity type semiconductor layer 404 is p-type, the second conductivity type semiconductor layer 408 is n-type; and while the first conductivity type semiconductor layer 404 is n-type, the second conductivity type semiconductor layer 408 is p-type. Generally, a buffer layer 402 is selectively deposited before the growth of the first conductivity type semiconductor layer 404 for successful growth of the first conductivity type semiconductor layer 404. Accordingly, the illuminant epitaxial structure 410 in the embodiment further comprises the buffer layer 402 between the substrate 400 and the first conductivity type semiconductor layer 404. For example, the material of the first conductivity type semiconductor layer 404 and the second conductivity type semiconductor layer 408 is GaN, and the active layer 406 is composed of an InGaN/GaN MQW structure. After the illuminant epitaxial structure 410 is formed, a definition step is performed by, for example, a photolithograph and etching technique, so as to remove a portion of the second conductivity type semiconductor layer 408 and a portion of the active layer 406 until the underlying first conductivity type semiconductor layer 404 is exposed, and to make the first conductivity type semiconductor layer 404 have an exposed portion 412. Then, a transparent electrode 426 is formed to cover a portion of the second conductivity type semiconductor layer 408. Next, an electrode 428 and an electrode 430 are respectively formed on the exposed portion 412 of the first conductivity type semiconductor layer 404 and the transparent electrode 426 on the second conductivity type semiconductor layer 408 by, for example, a sputtering technique or an evaporation technique, such as shown in FIG. 4a. The electrodes 428 and 430 are preferably metal electrodes for better electrical conductivity.

Figure 4B:
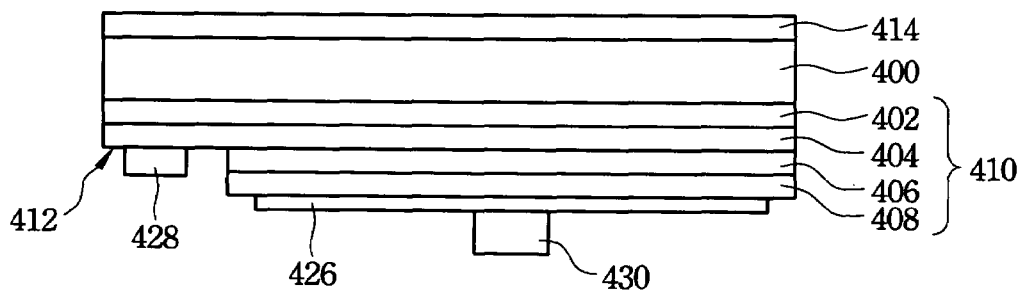

Alternatively, a substrate-thinned treatment is performed to decrease the thickness of the substrate 400. A metal layer 414 is formed on the surface of the substrate opposite to the illuminant epitaxial structure 410 by, for example, a sputtering method or an evaporation deposition method, such as shown in FIG. 4b. The material of the metal layer 414 may be Al, Mn, Zn, Ni, Ag or Ti, and the thickness of the metal layer 414 is preferably between about 1 nm and about 1000 nm.

Figure 4C:
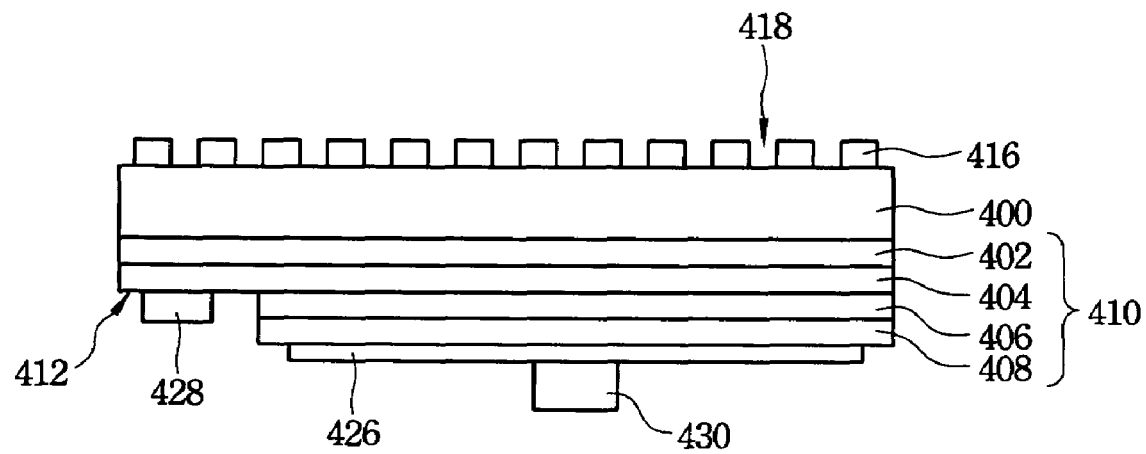
Figure 4D:
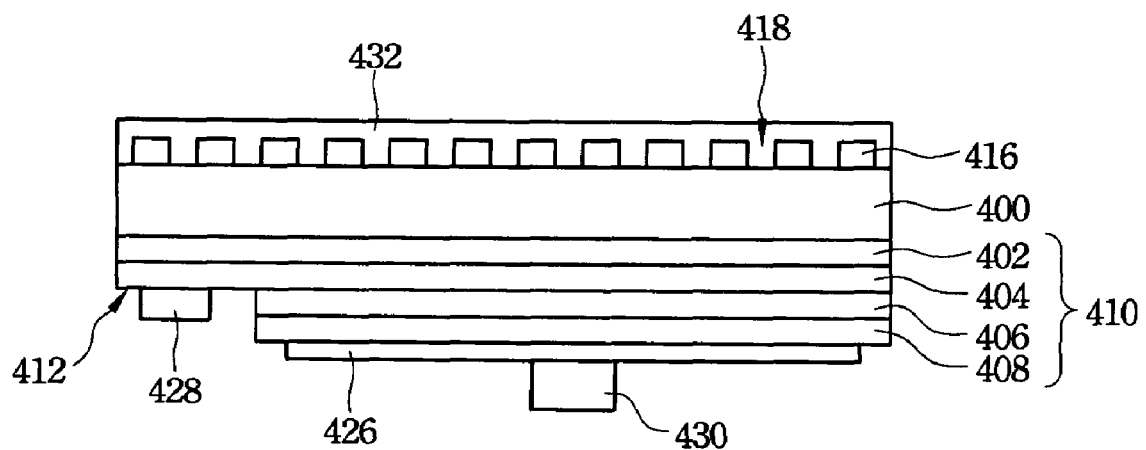
Figure 4E:
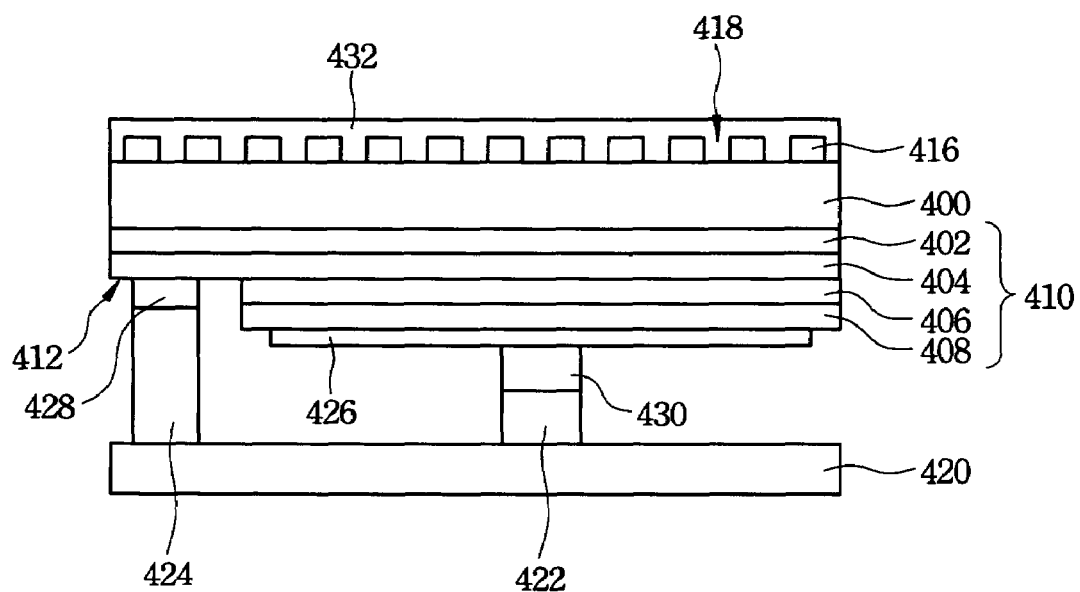
Figure 4F:
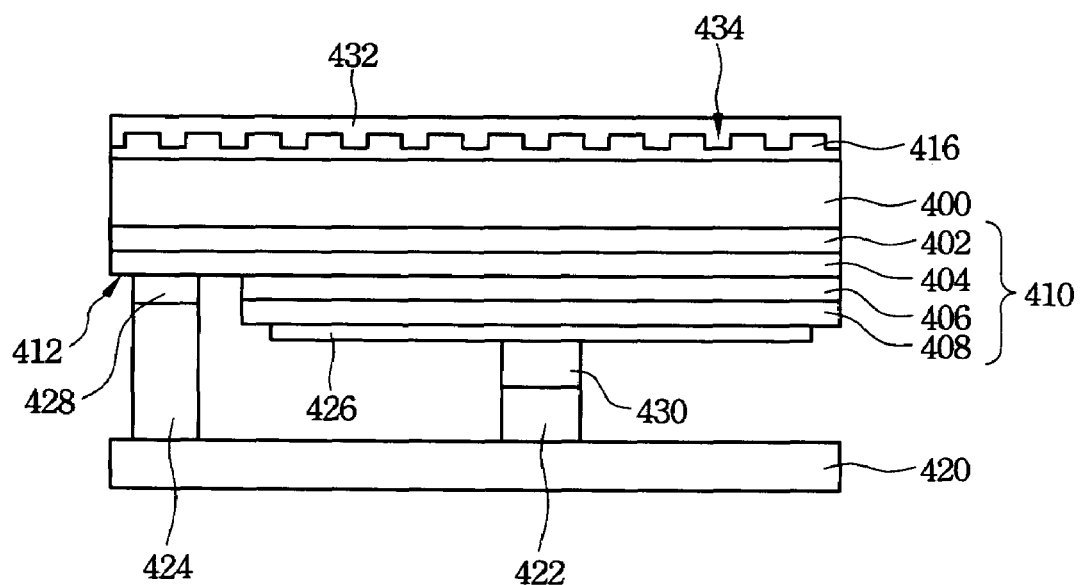
FIG. 4f is a schematic diagram showing the modification process for manufacturing a light-emitting diode in accordance with the fourth preferred embodiment of the present invention.

Next, an anodic oxidization step is performed on the metal layer 414 to make the metal layer 414 turn into a metal oxide layer 416. In a preferred embodiment of the present invention, the reaction voltage is preferably controlled between about 2 V and about 100 V during the anodic oxidization step. After the anodic oxidization step, the metal oxide layer 416 including a porous structure is formed from the metal layer 414. A plurality of holes arranged orderly are formed in the surface of the metal oxide layer 416 by appropriately controlling the oxidation condition, such as oxidation voltage. A portion of the metal oxide layer 416 is removed by an etch solution through a wet etching method, wherein the etch solution is preferably an acid solution, such as a phosphoric acid solution, an oxalic acid solution or a sulfuric acid solution. The surface of the metal oxide layer 416 has included holes arranged orderly, so that a plurality of holes 418 can be formed and uniformly distributed in the metal oxide layer 416 to expose the underlying surface of the substrate 400, such as shown in FIG. 4c. As a result, the effect of uniformly roughening the light-extracting surface of the light-emitting diode device can be achieved. The sizes of the holes 418 and the pitches between the holes 418 can be adjusted by modifying the parameters, such as the composition and the concentration of the etch solution, the etching time and temperature. The dimensions of the holes 418 may be between about 1 nm and about 1000 nm. In other embodiments, after the metal oxide layer 416 is etched, a plurality of holes 434 distributed uniformly are formed, and the holes 434 do not penetrate through the metal oxide layer 416, as shown in FIG. 4f, wherein such a porous structure can increase the light extraction efficiency exactly at the surface of the substrate 400. A dielectric layer 432 is formed to cover the metal oxide layer 416 and the exposed surface of the substrate 400 by, for example, a deposition method, so as to complete the light-emitting diode device, such as shown in FIG. 4d or FIG. 4f.

Next, a conductive sub-mount 420 is provided, wherein at least two bonding bumps 422 and 424 are set on a surface of the sub-mount 420. The locations of the bonding bumps 422 and 424 are respectively corresponding to those of the electrodes 430 and 428. Subsequently, a flip chip step is performed to respectively connect the electrodes 428 and 430 with the bonding bumps 424 and 422 of the sub-mount 420, so as to complete the fabrication of the light-emitting diode device, such as shown in FIG. 4e or FIG. 4f.

FIGS. 5a through 5f are schematic flow diagrams showing the process for manufacturing a light-emitting diode in accordance with a fifth preferred embodiment of the present invention. In the present embodiment, a substrate 500 is firstly provided for growing epitaxial materials thereon, wherein the substrate 500 may be made of semiconductor materials, such as sapphire or SiC. An illuminant epitaxial structure 508 is grown on a surface of the substrate 500 by, for example, an epitaxial method, so as to form a structure shown in FIG. 5a. The illuminant epitaxial structure 508 may be composed of AlGaInN based materials. Typically, the illuminant epitaxial structure 508 may comprise a first conductivity type semiconductor layer 502, an active layer 504 and a second conductivity type semiconductor layer 506 stacked on the substrate 500 in sequence, wherein the first conductivity type semiconductor layer 502 and the second conductivity type semiconductor layer 506 have different conductivity types. While the first conductivity type semiconductor layer 502 is p-type, the second conductivity type semiconductor layer 506 is n-type; and while the first conductivity type semiconductor layer 502 is n-type, the second conductivity type semiconductor layer 506 is p-type. For example, the material of the first conductivity type semiconductor layer 502 and the second conductivity type semiconductor layer 506 is GaN, and the active layer 504 is composed of an InGaN/GaN MQW structure.

Figure 5A:
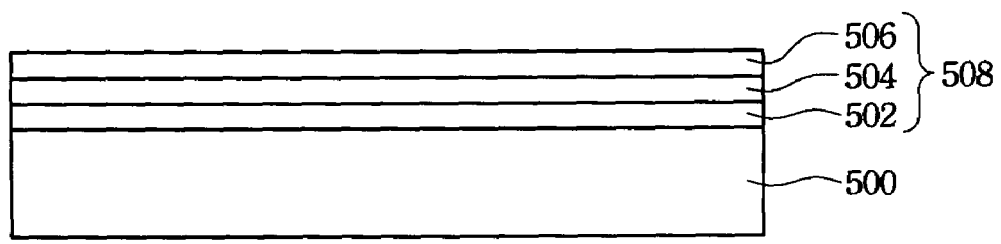
FIGS. 5a through 5f are schematic flow diagrams showing the process for manufacturing a light-emitting diode in accordance with a fifth preferred embodiment of the present invention.
Figure 5B:
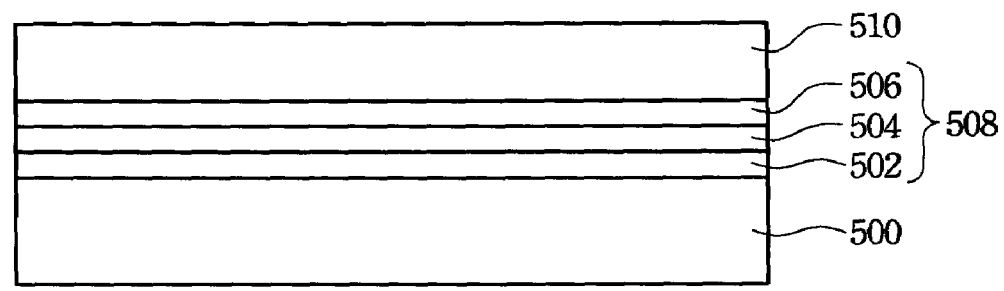
Figure 5C:
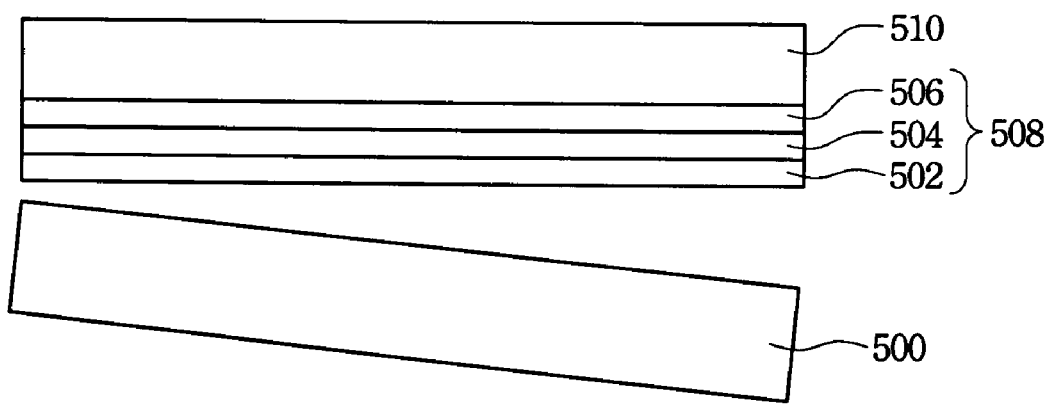

Then, another substrate 510 is provided and is jointed to a surface of the illuminant epitaxial structure 508 opposite to the growth substrate 500 by, for example, a wafer bonding method, such that a structure illustrated in FIG. 5b is formed. The substrate 510 is preferably composed of a transparent material, such as sapphire or glass. The growth substrate 500 is next removed by, for example, an etching technique, a polishing technique or a laser technique, until the surface of the illuminant epitaxial structure 508 where the growth substrate 500 is deposed is exposed, such as shown in FIG. 5c.

After the growth substrate 500 is removed, a definition step is performed by, for example, a photolithograph and etching technique, so as to remove a portion of the first conductivity type semiconductor layer 502 and a portion of the active layer 504 until the underlying second conductivity type semiconductor layer 506 is exposed, and to make the second conductivity type semiconductor layer 506 have an exposed portion 512.

Then, a metal layer (not shown) is formed on a portion of the surface of the remaining first conductivity type semiconductor layer 502 by, for example, a sputtering method or an evaporation deposition method combining with a photolithograph and etching technique or a lift-off technique, so that the other portion of the surface of the remaining first conductivity type semiconductor layer 502 is exposed. The material of the metal layer may be Al, Mn, Zn, Ni, Ag or Ti, and the thickness of the metal layer is preferably between about 1 nm and about 1000 nm. Next, an anodic oxidization step is performed to make the metal layer turn into a metal oxide layer 518. In a preferred embodiment of the present invention, the reaction voltage is preferably controlled between about 2 V and about 100 V during the anodic oxidization step. After the anodic oxidization step, the metal oxide layer 518 including a porous structure is formed from the metal layer. A plurality of holes arranged orderly are formed in the surface of the metal oxide layer 518 by appropriately controlling the oxidation condition, such as oxidation voltage. After the metal oxide layer 518 is formed, a portion of the metal oxide layer 518 is removed by an etch solution through a wet etching method, wherein the etch solution is preferably an acid solution, such as a phosphoric acid solution, an oxalic acid solution or a sulfuric acid solution. The surface of the metal oxide layer 518 has included holes arranged orderly, so that a plurality of holes 520 can be formed and uniformly distributed in the metal oxide layer 518 for uniformly roughening the light-extracting surface of the light-emitting diode device. The sizes of the holes 520 and the pitches between the holes 520 can be adjusted by modifying the parameters, such as the composition and the concentration of the etch solution, the etching time and temperature. In the present invention, the dimensions of the holes 520 may be between about 1 nm and about 1000 nm. The holes 520 penetrate through the metal oxide layer 518 to expose the underlying surface of the first conductivity type semiconductor layer 502. However, in other embodiments, after the metal oxide layer is etched, a plurality of holes distributed uniformly are formed, and the holes do not penetrate through the metal oxide layer.

Figure 5D:
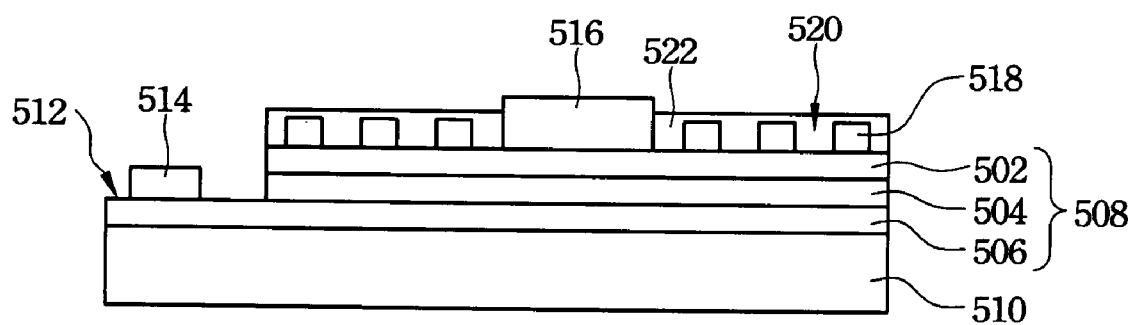
Figure 5E:
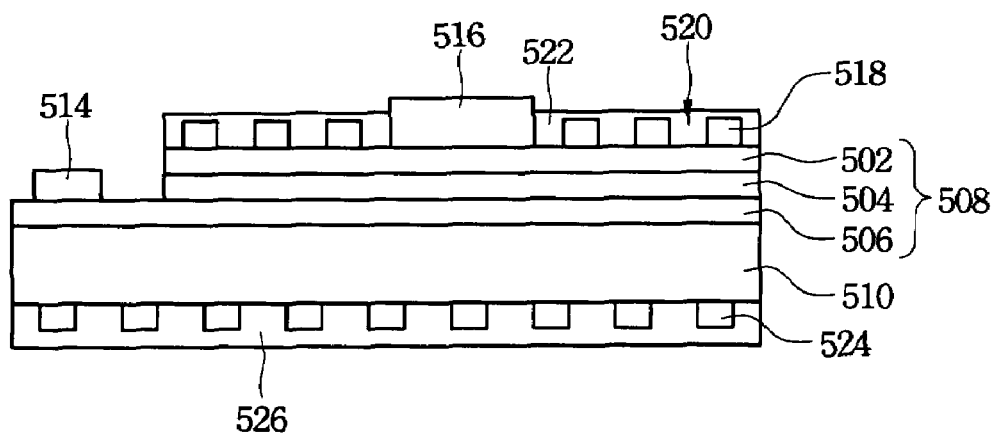

Then, a transparent electrode 522 is alternatively formed to cover the metal oxide layer 518, the holes 520 and the surface of the first conductivity type semiconductor layer 502 exposed by the holes 520. A material of the transparent electrode 522 is, for example, ITO or IZO. Next, an electrode 514 and an electrode 516 are respectively formed on the exposed portion 512 of the second conductivity type semiconductor layer 506 and the exposed portion of the first conductivity type semiconductor layer 502 by, for example, a sputtering technique or an evaporation technique, such as shown in FIG. 5d. The electrodes 514 and 516 are preferably metal electrodes for better electricity. Subsequently, a metal oxide layer 524 including nano holes is formed on a portion of a surface of the substrate 510 opposite to the illuminant epitaxial structure 508 by, for example, deposition, anodic oxidization and etching processes, and the other portion of the surface of the substrate 510 is exposed. A dielectric layer 526 is formed to cover the metal oxide layer 524 and the exposed surface of the substrate 510 by, for example, a deposition method, so as to form a structure such as shown in FIG. 5e. A material of the dielectric layer 526 may be silicon oxide or silicon nitride.

Figure 5F:
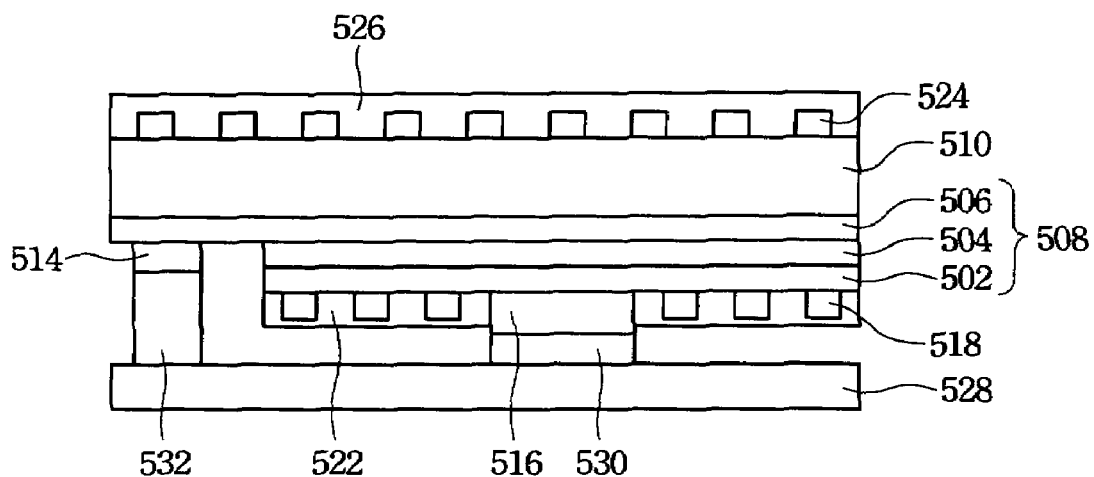

Next, a conductive sub-mount 528 is provided, wherein at least two bonding bumps 530 and 532 are set on a surface of the sub-mount 528. The locations of the bonding bumps 530 and 532 are respectively corresponding to those of the electrodes 516 and 514. Subsequently, a flip chip step is performed to respectively connect the electrodes 516 and 514 with the bonding bumps 530 and 532 of the sub-mount 528, so as to complete the fabrication of the light-emitting diode device, such as shown in FIG. 5f.

According to the aforementioned description, one advantage of the present invention is that a metal layer on a surface of the light-emitting diode is oxidized by an anodic oxidization method, and a portion of the produced metal oxide layer is removed by etching in the present invention, so that the metal oxide layer including a plurality of uniform nanoscale holes are produced to achieve the effect of roughening the surface of the light-emitting diode, thereby effectively enhancing the light extraction of the light-emitting diode.

According to the aforementioned description, another advantage of the present invention is that a plurality of nanoscale holes arranged uniformly can be formed simply by an anodic oxidization and etching method, and the sizes of the holes and the pitches between the holes can be precisely modified by controlling the etching parameters. Therefore, the process of the method is very simple, thereby effectively increasing the production yield of the light-emitting diode.

According to the aforementioned description, still another advantage of the present invention is that the light-extracting surface of the light-emitting diode is set with an anodic oxidization metal layer, and the anodic oxidization metal layer includes a plurality of nanoscale holes arranged uniformly, so that the light-emitting diode has superior light extraction efficiency, thereby greatly increasing the light output of the light-emitting diode and effectively broadening the application scope of the light-emitting diode.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for manufacturing a light-emitting diode, comprising:
   providing an illuminant epitaxial structure, wherein the illuminant epitaxial structure has a first surface and a second surface on opposite sides, and a substrate is deposed on the first surface of the illuminant epitaxial structure;
   forming a metal layer on the second surface of the illuminant epitaxial structure;
   performing an anodic oxidization step to oxidize the metal layer, so as to form a metal oxide layer; and
   performing an etching step to remove a portion of the metal oxide layer, so as to form a plurality of holes in the metal oxide layer.

2. The method for manufacturing a light-emitting diode according to claim 1, wherein a material of the metal layer is Al, Mn, Zn, Ni, Ag or Ti.

3. The method for manufacturing a light-emitting diode according to claim 1, wherein dimensions of the holes are between about 1 nm and about 1000 nm.

4. The method for manufacturing a light-emitting diode according to claim 1, wherein the etching step comprises using an etch solution, and the etch solution is a phosphoric acid solution, an oxalic acid solution or a sulfuric acid solution.

5. The method for manufacturing a light-emitting diode according to claim 1, wherein the illuminant epitaxial structure comprises a first conductivity type semiconductor layer, an active layer and a second conductivity type semiconductor layer stacked in sequence, and the first conductivity type semiconductor layer and the second conductivity type semiconductor layer have different conductivity types.

6. The method for manufacturing a light-emitting diode according to claim 5, wherein the metal layer is located on a first portion of the second surface of the illuminant epitaxial structure, and a second portion of the second surface of the illuminant epitaxial structure is exposed.

7. The method for manufacturing a light-emitting diode according to claim 6, further comprising performing a substrate-thinned step.

8. The method for manufacturing a light-emitting diode according to claim 7, further comprising forming two metal electrodes respectively deposed on the second portion of the second surface of the illuminant epitaxial structure and an exposed surface of the substrate.

9. The method for manufacturing a light-emitting diode according to claim 6, wherein the holes expose a portion of the first portion of the second surface of the illuminant epitaxial structure.

10. The method for manufacturing a light-emitting diode according to claim 6, wherein the holes do not expose a portion of the first portion of the second surface of the illuminant epitaxial structure.

11. The method for manufacturing a light-emitting diode according to claim 6, wherein the step of providing the illuminant epitaxial structure comprises:
providing another substrate;
forming the illuminant epitaxial structure on the another substrate, wherein the another substrate is deposed on the second surface of the illuminant epitaxial structure;
deposing the substrate on the first surface of the illuminant epitaxial structure; and
removing the another substrate to expose the second surface of the illuminant epitaxial structure.

12. The method for manufacturing a light-emitting diode according to claim 11, further comprising forming two metal electrodes respectively deposed on the second portion of the second surface of the illuminant epitaxial structure and an exposed surface of the substrate.

13. The method for manufacturing a light-emitting diode according to claim 5, wherein the illuminant epitaxial structure further comprises a buffer layer located between the substrate and the first conductivity type semiconductor layer.

14. The method for manufacturing a light-emitting diode according to claim 13, further comprising removing a portion of the second conductivity type semiconductor layer and a portion of the active layer to expose a portion of the first conductivity type semiconductor layer before the step of the forming the metal layer.

15. The method for manufacturing a light-emitting diode according to claim 14, wherein the metal layer is located on a first portion of a remaining portion of the second conductivity type semiconductor layer to expose a second portion of the remaining portion of the second conductivity type semiconductor layer.

16. The method for manufacturing a light-emitting diode according to claim 15, further comprising performing a substrate-thinned step after the anodic oxidization step.

17. The method for manufacturing a light-emitting diode according to claim 15, further comprising forming two metal electrodes respectively deposed on the exposed portion of the first conductivity type semiconductor layer and the second portion of the remaining portion of the second conductivity type semiconductor layer.

18. The method for manufacturing a light-emitting diode according to claim 17, further comprising forming a transparent electrode to cover the metal oxide layer and the holes between the anodic oxidization step and the step of forming the metal electrodes.

19. The method for manufacturing a light-emitting diode according to claim 1, wherein a thickness of the metal layer is between about 1 nm and about 1000 nm.

20. The method for manufacturing a light-emitting diode according to claim 1, wherein a reaction voltage is controlled between about 2 V and about 100 V when the anodic oxidization step is performed.

21. A method for manufacturing a light-emitting diode, comprising:
providing a substrate, wherein the substrate has a first surface and a second surface on opposite sides;
forming an illuminant epitaxial structure on the first surface of the substrate, wherein the illuminant epitaxial structure comprises a first conductivity type semiconductor layer, an active layer and a second conductivity type semiconductor layer stacked on the substrate in sequence, and the first conductivity type semiconductor layer and the second conductivity type semiconductor layer have different conductivity types;
removing a portion of the second conductivity type semiconductor layer and a portion of the active layer to expose a portion of the first conductivity type semiconductor layer;
forming a metal layer on the second surface of the substrate;
performing an anodic oxidization step to oxidize the metal layer, so as to form a metal oxide layer;
performing an etching step to remove a portion of the metal oxide layer, so as to form a plurality of holes in the metal oxide layer;
providing a sub-mount, wherein at least two bonding bumps are set on a surface of the sub-mount; and
performing a flip chip step to make the exposed portion of the first conductivity type semiconductor layer and the second conductivity type semiconductor layer respectively connect with the bonding bumps on the sub-mount.

22. The method for manufacturing a light-emitting diode according to claim 21, wherein a material of the metal layer is Al, Mn, Zn, Ni, Ag or Ti.

23. The method for manufacturing a light-emitting diode according to claim 21, wherein a thickness of the metal layer is between about 1 nm and about 1000 nm.

24. The method for manufacturing a light-emitting diode according to claim 21, wherein a reaction voltage is controlled between about 2 V and about 100 V when the anodic oxidization step is performed.

25. The method for manufacturing a light-emitting diode according to claim 21, wherein dimensions of the holes are between about 1 nm and about 1000 nm.

26. The method for manufacturing a light-emitting diode according to claim 21, wherein the holes expose a portion of the second surface of the substrate.

* * * * *